United States Patent
Tyszka et al.

(10) Patent No.: US 7,633,295 B2
(45) Date of Patent: Dec. 15, 2009

(54) MAGNETIC RESONANCE STAGE MICROSCOPE

(75) Inventors: Julian Michael Tyszka, Altadena, CA (US); Andrey V. Demyanenko, South Pasadena, CA (US); Yun Kee, San Marino, CA (US); Scott E. Fraser, La Canada, CA (US)

(73) Assignee: California Institute of Technology, Pasadena, CA (US)

( * ) Notice: Subject to any disclaimer, the term of this patent is extended or adjusted under 35 U.S.C. 154(b) by 111 days.

(21) Appl. No.: 12/109,174

(22) Filed: Apr. 24, 2008

(65) Prior Publication Data

US 2008/0284430 A1    Nov. 20, 2008

Related U.S. Application Data

(60) Provisional application No. 60/926,324, filed on Apr. 26, 2007.

(51) Int. Cl.
*G01V 3/00* (2006.01)
(52) U.S. Cl. .................. 324/318; 324/322; 324/309; 324/307
(58) Field of Classification Search ......... 324/300–322; 600/407–435
See application file for complete search history.

(56) References Cited

U.S. PATENT DOCUMENTS

| | | | |
|---|---|---|---|
| 4,825,162 A | 4/1989 | Roemer et al. | |
| 6,683,451 B1 * | 1/2004 | Moore et al. | 324/218 |
| 6,836,112 B2 * | 12/2004 | Hennessy | 324/300 |
| 6,982,552 B2 | 1/2006 | Hardy et al. | |
| 7,400,144 B2 * | 7/2008 | Tsuji et al. | 324/300 |
| 7,403,008 B2 * | 7/2008 | Blank et al. | 324/316 |
| 2004/0056657 A1 * | 3/2004 | Hennessy | 324/300 |
| 2006/0022675 A1 * | 2/2006 | Blank et al. | 324/316 |
| 2007/0216412 A1 * | 9/2007 | Tsuji et al. | 324/318 |
| 2008/0284430 A1 * | 11/2008 | Tyszka et al. | 324/307 |

OTHER PUBLICATIONS

Caparelli, E.C., Tomasi, D., Panepucci, H., 1999. Shielded biplanar gradient coil design. J Magn Reson Imaging 9, 725-731.
Chance, B., Cope, M., Gratton, E., Ramanujam, N., Tromberg, B., 1998. Phase measurement of light absorption and scatter in human tissue. Review of Scientific Instruments 69, 3457-3481.
Dodd, S., Chien, H., 2002. Short planar gradient coils for MR microscopy using concentric return paths. Journal of Magnetic Resonance 156, 1-9.

(Continued)

*Primary Examiner*—Diego Gutierrez
*Assistant Examiner*—Tiffany A Fetzner
(74) *Attorney, Agent, or Firm*—Steinfl & Bruno (57) ABSTRACT

A magnetic resonance (MR) microscope and a dual-mode optic and MR microscope system are disclosed. The MR microscope is provided with a horizontal stage above which a sample to be analyzed is located, a radiofrequency coil assembly located above the horizontal stage and below the sample, a magnetic field gradient module located under the horizontal stage, and a heat exchange unit thermally coupled to the magnetic field gradient module and located under the magnetic field gradient module. The dual-mode optic and MR microscope system is provided with an MR microscope and an optical microscope, the optical microscope comprising a mirror located above the sample.

23 Claims, 11 Drawing Sheets

OTHER PUBLICATIONS

Fisher, B.J., Dillon, N., Carpenter, T.A., Hall, L.D., 1997. Design of a biplanar gradient coil using a genetic algorithm. Magn Reson Imaging 15, 369-376.

Fraser, S.T., Hadjantonakis, A.K., Sahr, K.E., Willey, S., Kelly, O.G., Jones, E.A., Dickinson, M.E., Baron, M.H., 2005. Using a histone yellow fluorescent protein fusion for tagging and tracking endothelial cells in ES cells and mice. Genesis 42, 162-171.

Jacobs, R.E., Papan, C., Ruffins, S., Tyszka, J.M., Fraser, S.E., 2003a. MRI: volumetric imaging for vital imaging and atlas construction. Nature Cell Biology, Ss10-Ss16.

Jacobs, R.E., Ruffins, S., Pautler, R., Papain, C., Martin, M., Tyszka, M., 2003b. Microscopic resolution MRI: technology and applications. Journal of Neurochemistry 85, 59-59.

Jones, E.A., Baron, M.H., Fraser, S.E., Dickinson, M.E., 2004. Measuring hemodynamic changes during mammalian development. Am J Physiol Heart Circ Physiol 287, H1561-1569.

Jones, E.A., Baron, M.H., Fraser, S.E., Dickinson, M.E., 2005. Dynamic in vivo imaging of mammalian hematovascular development using whole embryo culture. Methods Mol Med 105, 381-394.

Jones, E.A., Crotty, D., Kulesa, P.M., Waters, C.W., Baron, M.H., Fraser, S.E., Dickinson, M.E., 2002. Dynamic in vivo imaging of postimplantation mammalian embryos using whole embryo culture. Genesis 34, 228-235.

Kowalski, M.E., Behnia, B., Webb, A.G., Jin, J.M., 2002. Optimization of electromagnetic phased-arrays for hyperthermia via magnetic resonance temperature estimation. IEEE Trans Biomed Eng 49, 1229-1241.

Lemdiasov, R., Ludwig, R., Brevard, M., Ferris, C., 2004. Design and implementation of a uniplanar gradient field coil for magnetic resonance imaging. Concepts in Magnetic Resonance Part B-Magnetic Resonance Engineering 20B, 17-29.

Lemdiasov, R.A., Ludwig, R., 2005. A stream function method for gradient coil design. Concepts in Magnetic Resonance Part B-Magnetic Resonance Engineering 26B, 67-80.

Liu, H., 2000. An efficient geometric image distortion correction method for a biplanar planar gradient coil. Magma 10, 75-79.

Liu, H., Truwit, C.L., 1998. True energy-minimal and finite-size biplanar gradient coil design for MRI. IEEE Trans Med Imaging 17, 826-830.

McNally, J.G., Karpova, T., Cooper, J., Conchello, J.A., 1999. Three-dimensional imaging by deconvolution microscopy. Methods 19, 373-385.

Minard, K.R., Holtom, G.R., Kathmann, L.E., Majors, P.D., Thrall, B.D., Wind, R.A., 2004. Simultaneous 1H PFG-NMR and confocal microscopy of monolayer cell cultures: effects of apoptosis and necrosis on water diffusion and compartmentalization. Magn Reson Med 52, 495-505.

Papan, C., Velan, S.S., Fraser, S.E., Jacobs, R.E., 2001. 3D time-lapse analysis of Xenopus gastrulation movements using mu MRI. Developmental Biology 235, 189-189.

Shi, F., Latour, L.L., Ludwig, R., Sotak, C.H., 1996. A new design for a three-channel surface gradient coil employing a three-dimensional finite element model. Magnetic Resonance in Medicine 35, 596-605.

So, PT., Dong, C.Y., Masters, B.R., Berland, K.M., 2000. Two-photon excitation fluorescence microscopy. Annu Rev Biomed Eng 2, 399-429.

Sutton, B.P., Ciobanu, L., Zhang, X., Webb, A., 2005. Parallel imaging for NMR microscopy at 14.1 Tesla. Magn Reson Med 54, 9-13.

Tearney, G.J., Brezinski, M.E., Bouma, B.E., Boppart, S.A., Pitris, C., Southern, J.F , Fujimoto, J.G., 1997. In vivo endoscopic optical biopsy with optical coherence tomography. Science 276, 2037-2039.

Tomasi, D., 2001. Stream function optimization for gradient coil design. Magnetic Resonance in Medicine 45, 505-512.

Tomasi, D., Caparelli, E.C., Panepucci, H., Foerster, B., 1999. Fast optimization of a biplanar gradient coil set. Journal of Magnetic Resonance 140, 325-339.

Tromberg, B., Yodh, A., Sevick, E., Pine, D., 1997. Diffusing photons in turbid media: Introduction to the feature. Applied Optics 36, 9-9.

Turner, R., 1986. A Target Field Approach to Optimal Coil Design. Journal of Physics D-Applied Physics 19, L147-L151.

Tyszka, J.M., Fraser, S.E., Jacobs, R.E., 2005. Magnetic resonance microscopy: recent advances and applications. Curr Opin Biotechnol 16, 93-99.

Williams, G.B., Fisher, B.J., Huang, C.L., Carpenter, T.A., Hall, L.D., 1999. Design of biplanar gradient coils for magnetic resonance imaging of the human torso and limbs. Magn Reson Imaging 17, 739-754.

Wind, R.A., Minard, K.R., Holtom, C.R., Majors, P.D., Ackerman, E.J., Colson, S.D., Cory, D.G., Daly, D.S., Ellis, P.D., Metting, N.F., Parkinson, C.I., Price, J.M., Tang, X.W., 2000. An integrated confocal and magnetic resonance microscope for cellular research. J Magn Reson 147, 371-377.

Zhang, X., Webb, A., 2004. Design of a capacitively decoupled transmit/receive NMR phased array for high field microscopy at 14.1T. J Magn Reson 170, 149-155.

* cited by examiner

MAGNETIC RESONANCE STAGE MICROSCOPE

CROSS REFERENCE TO RELATED APPLICATIONS

The present application claims priority to U.S. Provisional Ser. No. 60/926,324 filed on Apr. 26, 2007, the contents of which are incorporated herein by reference in their entirety.

FEDERAL SUPPORT STATEMENT

The U.S. Government has certain rights in this invention pursuant to Grant No. DBI0552396 awarded by the National Science Foundation.

FIELD

The present disclosure relates to magnetic resonance microscopy. More in particular, it relates to a magnetic resonance stage microscope.

BACKGROUND

A magnetic resonance (MR) stage microscope combines the convenience and flexibility of an optical stage microscope with the unique strengths of magnetic resonance imaging, particularly the ability to image the internal structure of optically opaque organisms and samples. Magnetic resonance microscopy is typically defined as MR imaging with a spatial resolution less than approximately 100 microns. Most MR microscopy employs cylindrical gradient and radiofrequency (RF) coils which entirely or partially enclose an object. RF coils transmit signal to and receive signal from the resonant nuclei in the sample. Resonant frequencies at the magnetic field strengths used for nuclear magnetic resonance (NMR) and magnetic resonance imaging (MRI) (typically between 0.1 Tesla and 20 Tesla) are in the RF range. The gradient coils create linear, spatial variations in the magnetic field. When combined with the linear relation between magnetic field strength and resonance frequency, the position in space of a resonant nucleus (such as the proton nucleus of a hydrogen atom) can be determined by frequency analysis of the detected signal. This "frequency encoding" of position is fundamental to image formation in MRI. Typically, gradient coils provide independent linear magnetic field gradients in the x, y and z dimensions. This places severe restrictions on the dimensions of a sample and of the environment volume available for a living organism.

SUMMARY

According to a first aspect, a magnetic resonance microscope is provided, comprising: a horizontal stage above which a sample to be analyzed through the magnetic resonance microscope is adapted to be located; a radiofrequency coil assembly located above the horizontal stage, the sample adapted to be located above the radiofrequency coil assembly and to be excited by the radiofrequency coil assembly; a magnetic field gradient module to generate a magnetic field, the magnetic field gradient module located under the horizontal stage; and a heat exchange unit thermally coupled to the magnetic field gradient module and located under the magnetic field gradient module.

According to a second aspect, a dual-mode optic and magnetic resonance microscope system is provided, comprising: a) a magnetic resonance microscope; and b) an optical microscope, wherein the magnetic resonance microscope comprises: a1) a horizontal stage above which a sample to be analyzed through the magnetic resonance microscope and the optical microscope is adapted to be located; a2) a radiofrequency coil assembly located above the horizontal stage, the sample adapted to be located above the radiofrequency coil assembly and to be excited by the radiofrequency coil assembly, a3) a magnetic field gradient module to generate a magnetic field, the magnetic field gradient module located under the horizontal stage; and a4) a heat exchange unit thermally coupled to the magnetic field gradient module and located under the magnetic field gradient module, wherein the optical microscope comprises: b1) a mirror located above the sample.

Further embodiments of the present disclosure are shown in the specification, drawings and claims of the present application.

The MR stage microscope overcomes these limitations by employing gradient coils and radiofrequency coils placed below the sample, forming a horizontal "stage" with minimal restriction on the extent of the sample or surrounding medium and convenient access to the sample from above. The MR stage microscope is intended to be used as an insert within the uniform magnetic field of a horizontal-bore MR system, avoiding the poor main magnetic field homogeneity associated with other MR systems.

The MR stage microscope according to the present disclosure can be applied to any small, hydrated, opaque system, including embryos, insects, marine animals, biofilms, bioreactors, cell cultures, porous media and plants. The MR stage microscope is also applicable to larger organisms where magnetic resonance microscopy (MRM) of superficial structures is of interest.

The MR stage microscope provides access to the sample from above, allowing integration of optical imaging equipment with MR microscopy. Simultaneous optical imaging would allow correlation of superficial cell movements with deeper tissue organization from MRM.

Dual-mode imaging is most relevant for dynamic processes, where serial imaging of a given process by each modality is impossible. Such applications include short timescale biological processes, including organism development. Dual-mode MR-optical contrast agents, as they become available, are well-matched to the capabilities of the MR-optical stage microscope.

BRIEF DESCRIPTION OF THE DRAWINGS

The representations shown in the figures are not intended to be to scale.

DETAILED DESCRIPTION

Figure 1:
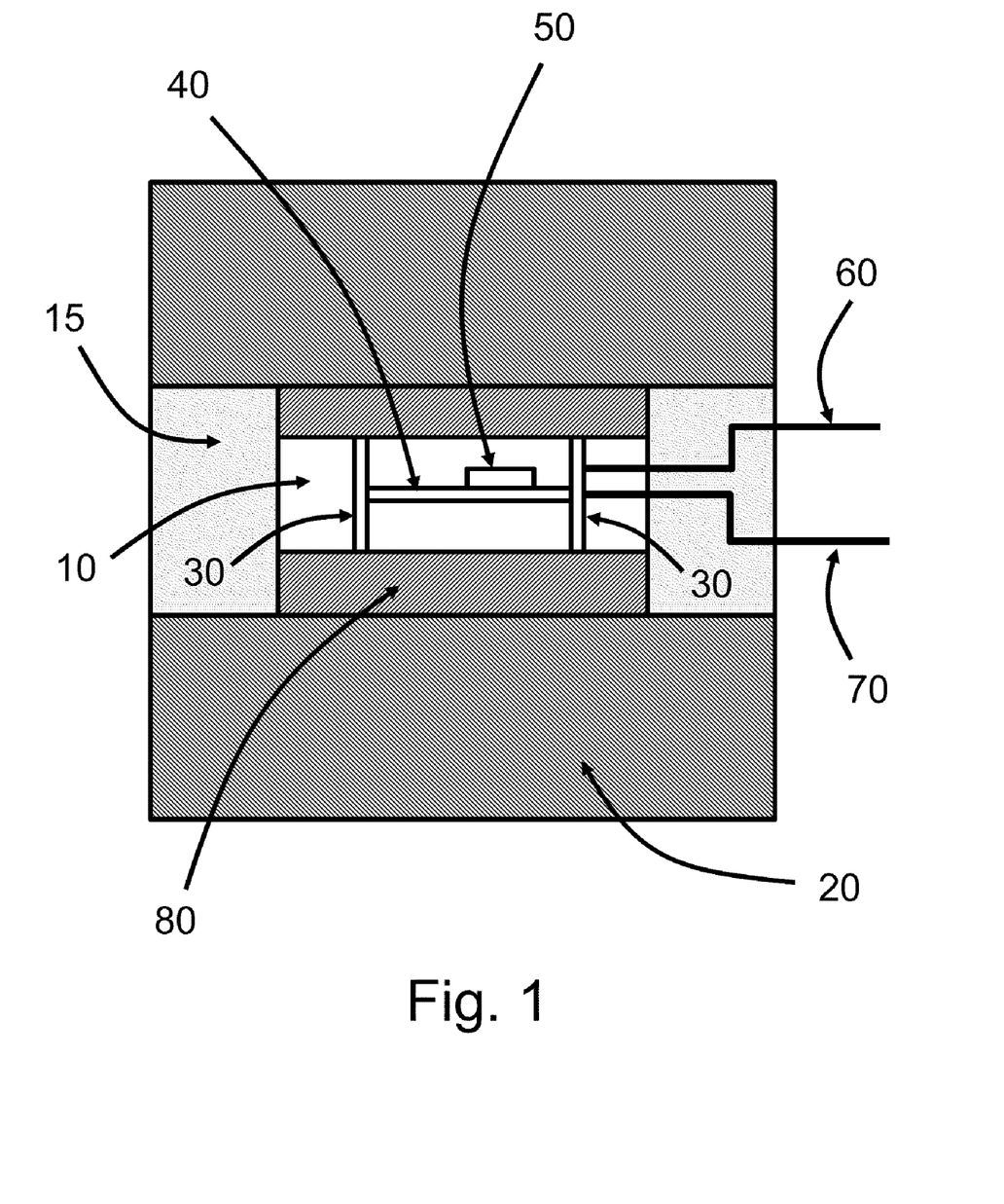
FIG. 1 is a cross sectional view showing positioning of a magnetic resonance (MR) stage microscope insert within a horizontal bore superconducting magnet.

FIG. 1 is a cross sectional view showing positioning of a magnetic resonance (MR) stage microscope insert (10) within a horizontal bore (15) superconductive magnet (20). Superconductive magnet (20) can be a conventional superconductive magnet, such as a magnet used in a clinical whole-body MRI scanner or research animal MRI scanner. In the embodiment of FIG. 1, the stage frame comprises two entire or partial circular polycarbonate disks (30) supporting a horizontal stage (40) which in turn holds a magnetic field gradient module, heat exchange, RF (radiofrequency) coil, temperature control manifold (all shown in the next figures) and a sample incubator or incubation chamber (50). An overhead optical microscope (not shown) may also be fitted above the insert (10) for dual-modal imaging, as later shown in the embodiment of FIGS. 5 and 6. Also shown in FIG. 1 are gradient and RF power cables (60), and water and compressed air supplies (70). Cables (60) and supplies (70) can be fed to the MR microscope from either end of the magnet bore. The MR stage microscope (10) can be mounted within cylindrical gradients and room temperature shim coils (80) or within the clear bore of the superconducting magnet (20). In many MRI scanners, the cylindrical gradients cannot be removed conveniently, but can be disconnected, in which case the independent gradients provided by the stage microscope of the present disclosure replace them functionally.

Figure 2:
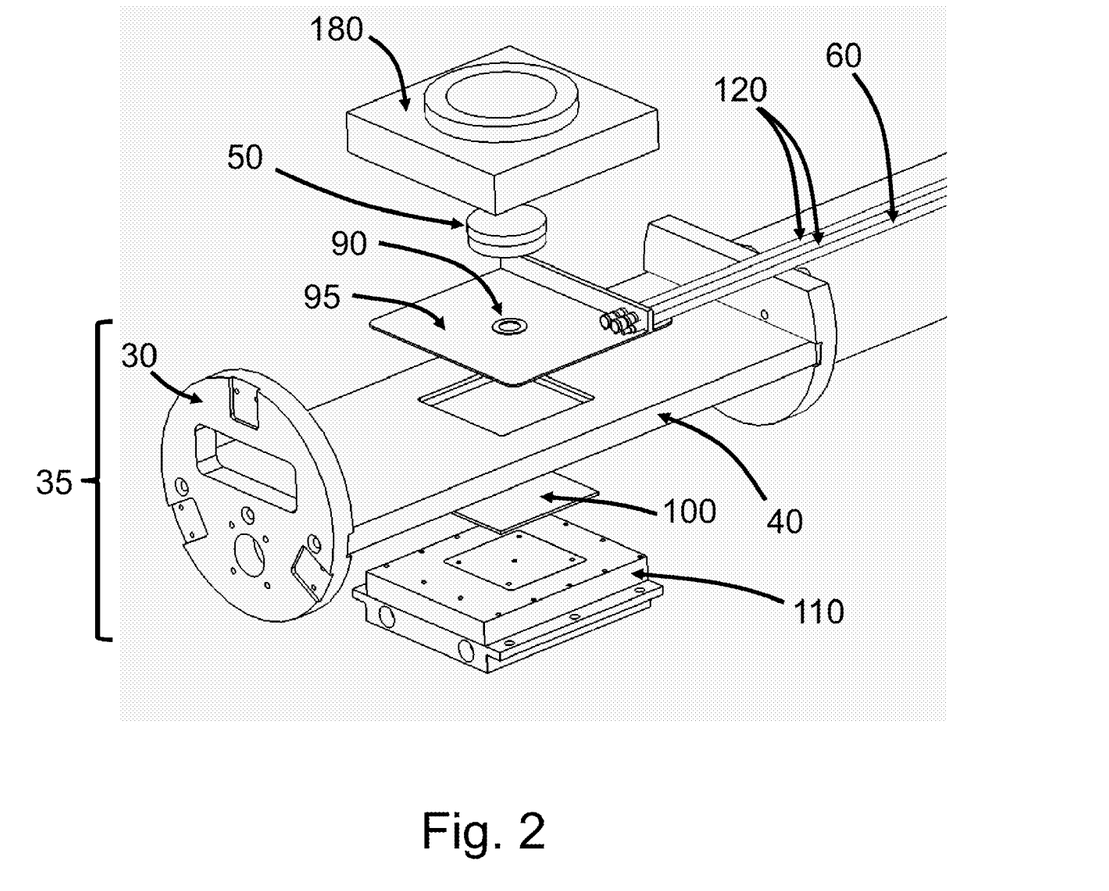
FIG. 2 shows an exploded perspective view of the major components of the stage microscope assembly in accordance with the present disclosure.

FIG. 2 shows an exploded perspective view of the major components of the stage microscope assembly in accordance with the present disclosure, incubation chamber (50), RF transmit/receiver coils (90), stage microscope frame (35) comprised of circular disks: (30) and horizontal stage (40), magnetic field gradient module (100) and chilled water heat exchange (110). The chilled water heat exchange (110) can be thermally coupled to the magnetic field gradient module (100) by a high thermal conductivity ceramic block (see element (150) of FIG. 3). High thermal conductivity can be, for example, 100 W/m/K at 20° C., or approximately 50 times that of Machinable Glass Ceramic. As shown in the embodiment of FIG. 2, two non-magnetic, non-conductive rods (120) for the RF coil(s) tune and match circuit are shown running from center to the right, paralleling the coaxial RF power cable (60). These rods (120) allow the RF coil (90) to be tuned to the resonance frequency of the nuclear spins and impedance matched to the RF amplifiers (not shown) while the stage assembly is at the center of the magnet bore.

RF coil (90) is located on an RF coil substrate (95). The RF coil substrate (95) provides both a mechanical support for the MF coil and the sample incubator (50), and also physically separates the sample from the later explained underlying active air-cooling layer. The substrate (95) is sufficiently large (typically 50-80 mm across) to allow attachment to the horizontal frame (40) at a distance from the conductive elements of the RF coil (90), increasing flexibility in the design of the RF coil (90) and associated circuitry.

The purpose of the horizontal frame (40) is to provide a rigid platform to which the electronic components (RF coils (90), gradient coils, etc) can be attached and for the sample within the incubation chamber (50). Gradient and RF coil modules can be attached by screws to machined flanges in the frame (40). See, for example, FIG. 3, later discussed. The frame (40) can be fabricated from materials that would not interact significantly with the polarizing field of the magnet, including plastics, resins, glass, ceramics and non-ferromagnetic metals. The stage allows accurate positioning of the MR hardware (gradient and RF coils) in the uniform field at the center of the MR magnet and of the sample at the isocenter of the MR coils. Peripheral wheels (not shown) which run within the bore of the magnet can be used to center the stage automatically within the bore. The stage frame (35) can be interfaced mechanically to existing positioning platforms and guides typically of commercial high-field MR systems. In the embodiment shown in FIG. 2, the incubation chamber (50) rests directly on the stage above the RF coil(s) (90) and magnetic field gradient module (100).

Figure 3:
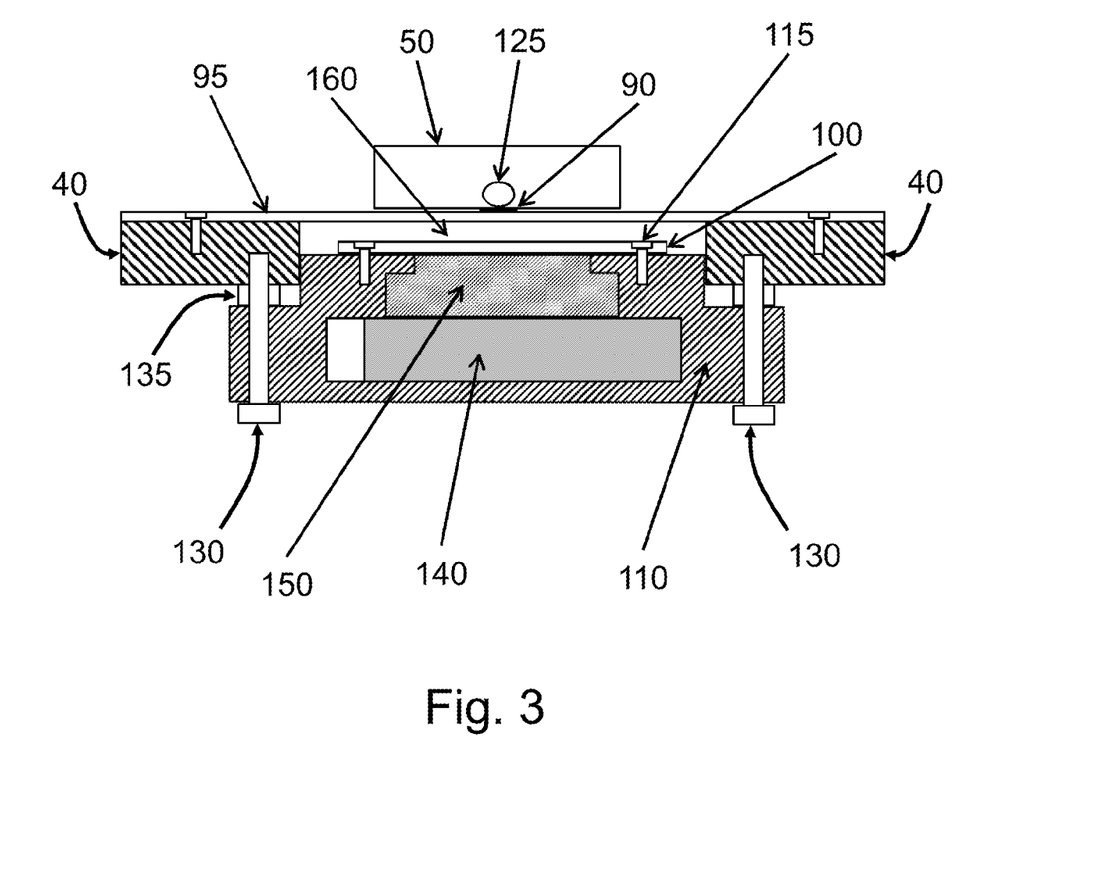
FIG. 3 shows a schematic cross sectional view of the core MR imaging components of the MR stage microscope.

FIG. 3 shows a schematic cross sectional view of the core MR imaging components of the MR stage microscope. A sample (125) is contained within the incubation chamber (50), typically surrounded by an appropriate medium (not shown), possibly surrounded by a Petri dish (not shown). As already discussed with reference to FIG. 2, the incubation chamber (50) can rest directly on one or more planar RF coils (90). According to further embodiments of the present disclosure, the coils can be slightly curved or half cylinders. The gradient coil module (100) under the RF coil support (95) can comprise three double-sided copper laminates (one for each direction of the field gradient, as later explained with reference to FIG. 9) on a high thermal conductivity substrate, insulated from each other by mylar film. The three laminates can be placed one above the other. The magnetic field gradient module (100) is coupled thermally to the cooling water of a water baffle (140) in the heat exchange module (110) by a block (150) of high thermal conductivity ceramic (e.g., Sharpal-M®). Cooling water can be circulated under pressure by an external chiller-pump (not shown). The RF coil substrate (95) can be attached to the horizontal stage (40) with non-ferromagnetic screws (e.g., nylon, brass, titanium). The gradient coil module (100), ceramic block (150) and heat exchange (110) are similarly attached together and secured to the stage frame (40) by screws (130) passing through spacing washers (135). The magnetic field gradient module (100) is secured to the heat exchange (110) by non-ferrous or nylon screws (115), trapping the ceramic block (150) between the lower aspect of the magnetic field gradient module (100) and the baffles (140) of the cooling water chamber.

Figure 7:
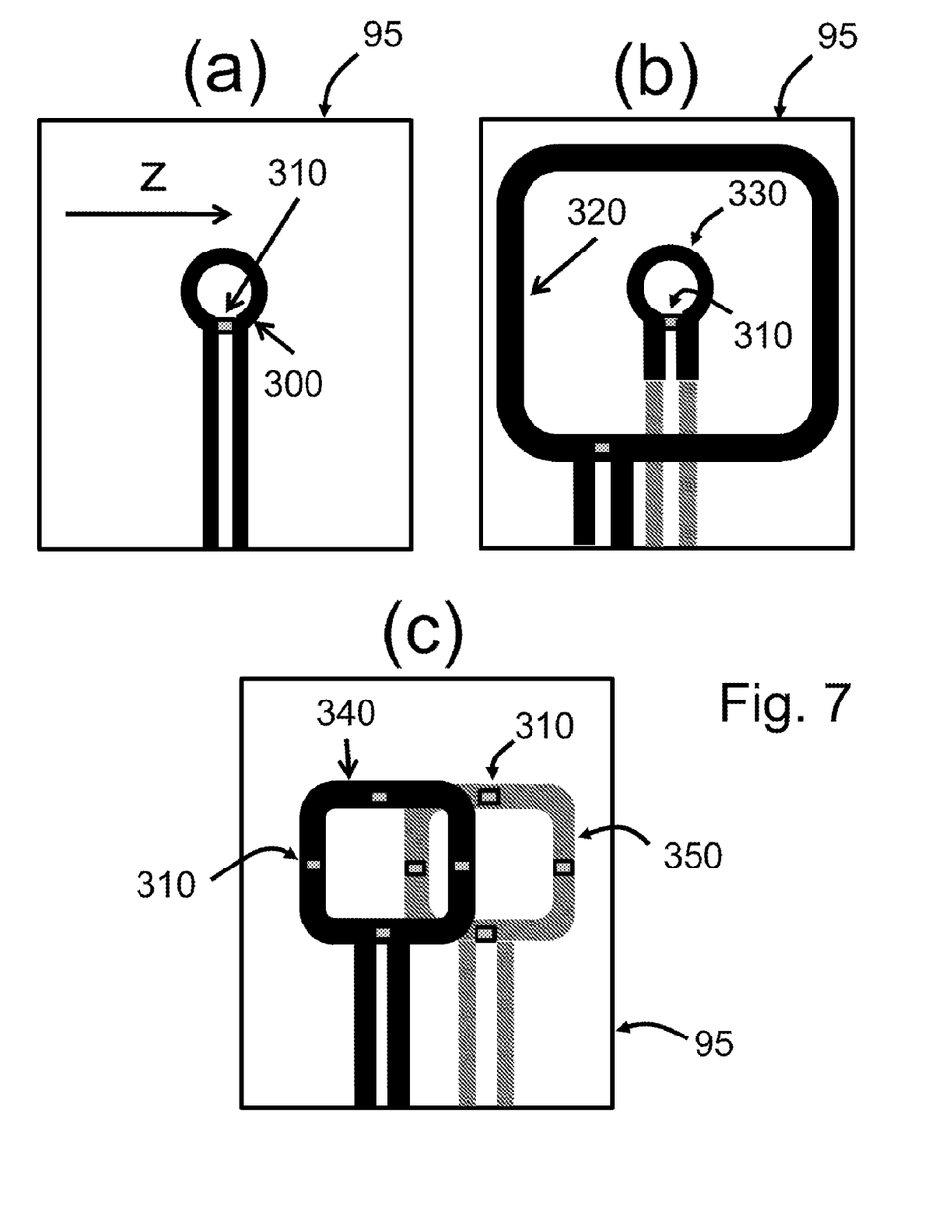
FIGS. 7(a)-7(c) show different embodiments of RF coils for use with the present disclosure.

In operation, the RF coil (90) excites the sample (125) and/or receives NMR signals from the sample (125). Usually, the sample size is less than 100 mm with a spatial resolution of less than 100 microns. Spatial resolution can be defined as the linear center-to-center distance between the reconstructed volume elements of the MR image without interpolation or spatial filtering. It corresponds approximately to the point-spread function of the MR image. It can be calculated as the field-of-view of the MR image divided by the number of spatial samples (matrix size) in each dimension, and need not be the same value for each dimension (anisotropic). The person skilled in the art will understand that a given planar RF coil (90) may be used for both transmission and reception of radiofrequency magnetic fields, or for either transmission or reception, in which case two mutually decoupled coils can be used. Multiple planar RF coils may be organized in a phased array either in the receive mode with a separate transmit coil (not shown), or as a transmit-receive array (later shown in FIG. 7). The RF coil support (95) is sufficiently stiff to support the incubation chamber (50) and to span an air cooling gap (160) between it and the top of the magnetic field gradient module (100). By way of example, the RF coil support or substrate (95) can be approximately 1 mm thick and spans a 50 mm gap in the upper surface of the stage platform. The air gap (160) between the RE coil substrate (95) and the magnetic field gradient module (100) can be approximately 1 mm deep. It should be noted that the magnetic field gradient module (100) and RF coil (90) are placed as closely as possible to the sample (125) in order to achieve high sensitivity and gradient efficiency.

Figure 10:
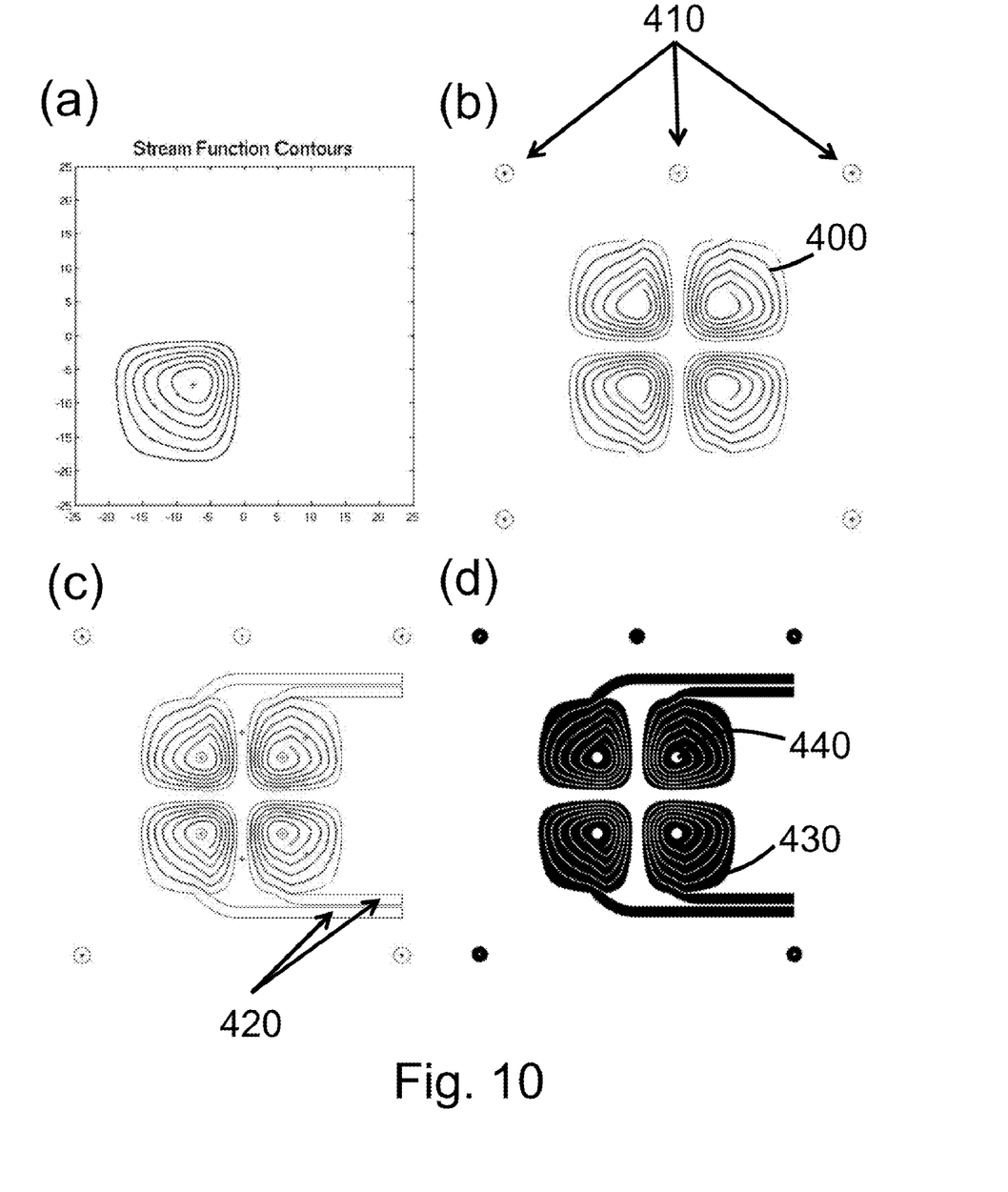
FIGS. 10(a)-10(d) show steps for obtaining conductor etching mask starting from stream function contours.
Figure 11:
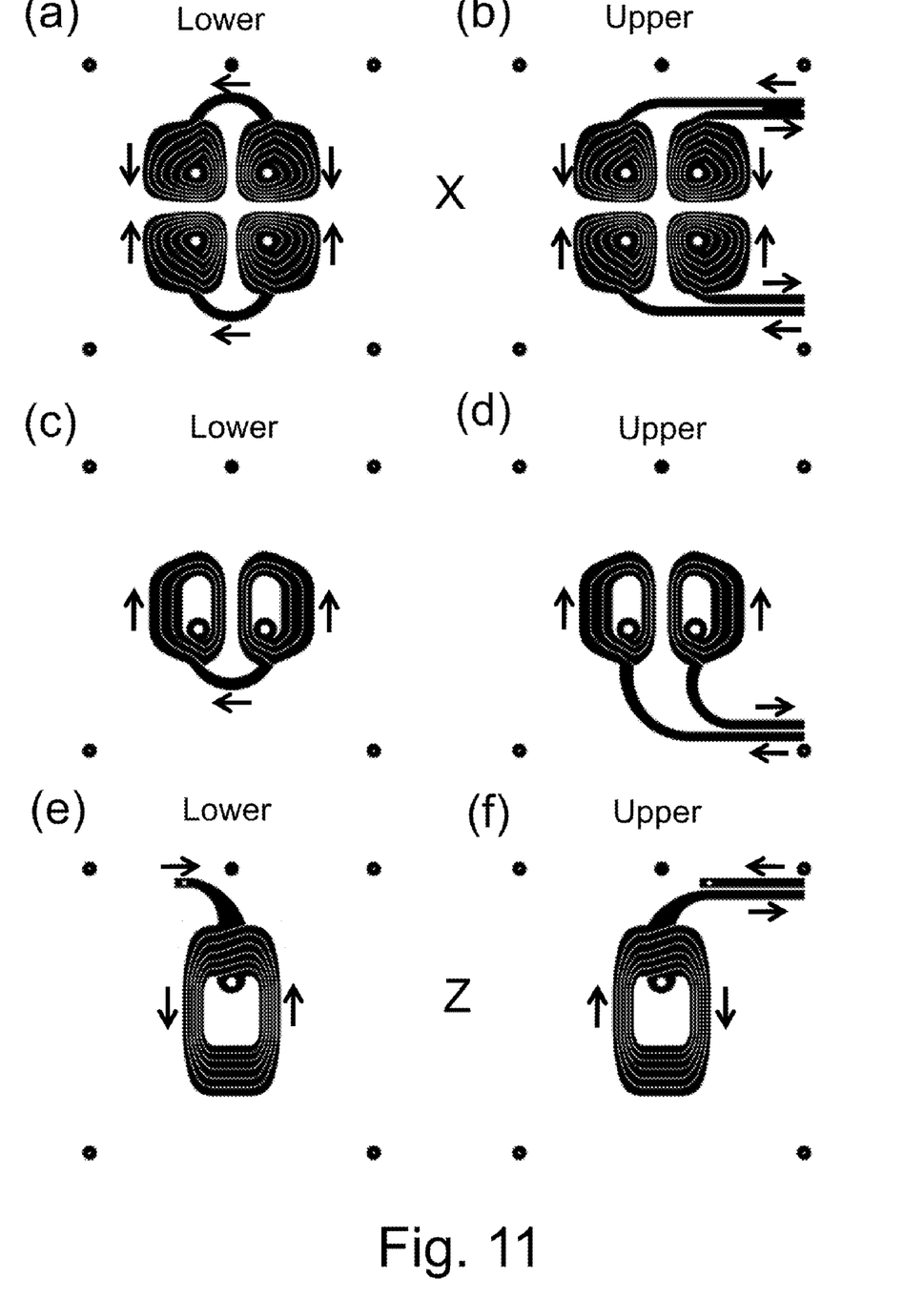
FIGS. 11(a)-11(f) show conductor etching masks for the magnetic field gradient module of the present disclosure.

The magnetic field gradient module (100) generates approximately linear variations of the z-component of the magnetic field (axial component parallel to the main polarizing magnetic field) in each of the three principal directions, x, y and z. Coil shapes for generation of such magnetic field will later be shown in FIGS. 10 and 11. Outside of the designed volume of uniformity, the field gradient becomes increasingly non-uniform. The field gradient allows image formation using conventional MRI pulse sequences in combination with excitation by the RF coil(s) by way of techniques known to the person skilled in the art, that will not be discussed here in detail. Gradient conductors should be actively cooled in small-scale, high performance MR gradient sets. As also mentioned above, water circulation through the gradient cooling system can be controlled by a commercial chiller pump routinely supplied with commercial MR consoles. Cooling water temperature should be maintained in the 10-15° C. range at a constant flow rate of several liters/minute. Typical MR water chillers can be used to provide adequate cooling for the MR stage microscope gradient set of the present disclosure.

The open, one-sided design (both the r coils and the gradient coils are under the horizontal stage, on the opposite side of the samples, which are above the horizontal stage) of the magnetic resonance imaging components, i.e. RF coil (90) and gradient set (100) allows one or more living samples to be maintained in a large volume of fluid medium, reducing the physiological impact of imaging on the organism while allowing easy access to the sample from above. Multiple small samples can be imaged using an appropriate array of radiofrequency coils (90), making screening of large groups of small organisms practical. Arrays of planar RF coils as such are known, for example, from U.S. Pat. No. 4,825,162, which is incorporated herein by reference in its entirety.

As noted above, the magnetic field gradient module (100) can be thermally coupled to the cooling water heat exchange (110), (140) by means of a high thermal conductive ceramics (150). This approach provides both efficient heat excitation from the magnetic field gradient module (100) and electrical insulation from the cooling water supply (110), (140). The ceramic block (150) allows the water cooling heat exchanger (140) to be placed at a moderate distance from the magnetic field gradient module (100), increasing design flexibility where space is at a premium. Resistive heating in the gradient conductors during operation of the MR microscope is conducted to the water cooled heat exchanger (140) below the magnetic field gradient module (100), on the opposite side from the sample stage.

Figure 4:
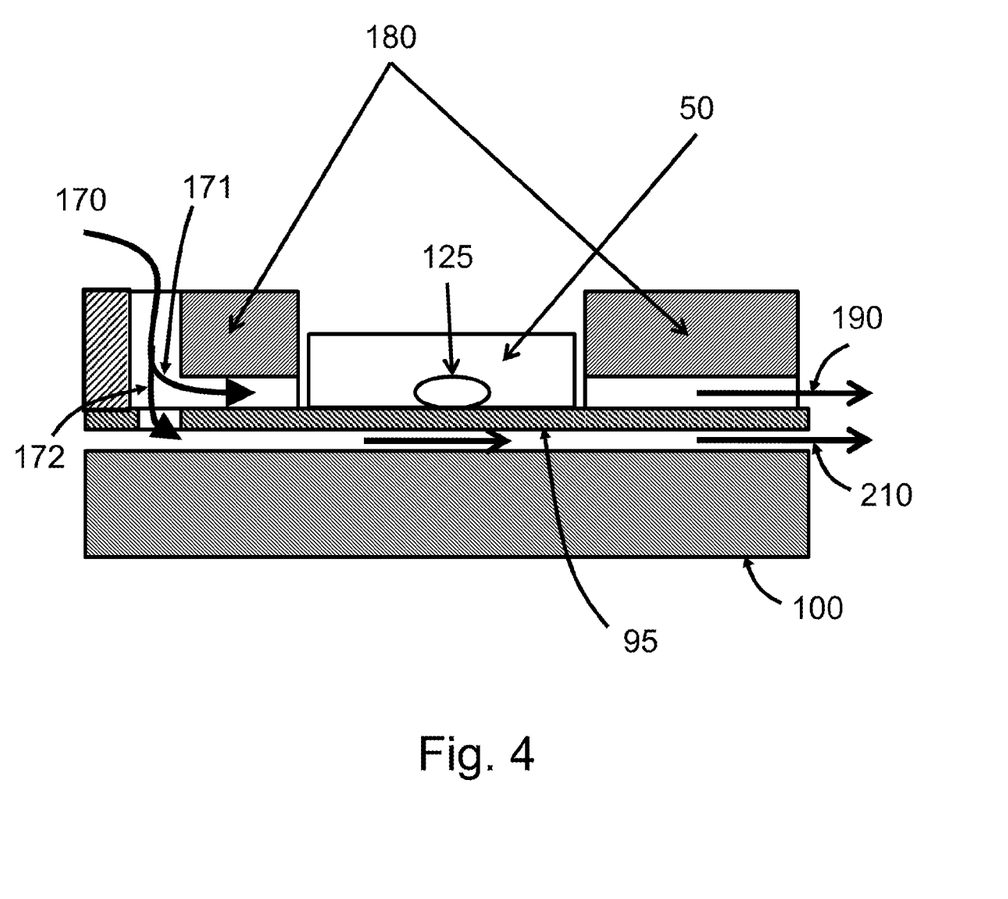
FIG. 4 is a cross sectional schematic view showing an arrangement for additional temperature control of the incubation chamber.

FIG. 4 is a cross sectional schematic view showing an arrangement for additional temperature control of the incubation chamber (50). Such additional temperature control is provided, in the embodiment of FIG. 4, by a thermostatically controlled airflow (170) around the chamber (171) and beneath the stage (172), the latter being provided between the RF coil substrate (95) and the top of the magnetic field gradient module (100). In particular, compressed air from a thermostatically controlled air heater-cooler system is fed into a thermostatic airflow manifold (180) secured to the top of the horizontal stage (40) and completely surrounding the sample incubator (50). According to an embodiment of the present disclosure, the manifold (180) surrounds the incubator, but allows optical access to the incubator from above, and is secured to the horizontal stage (40). The manifold (180) overlaps the area of the RF substrate (95), but is not connected directly to it. Air (170), (171) is allowed flow around the incubator (50) and is exhausted (190) at the far side of the manifold (180). A fraction of the air (171), (200), (210) is also allowed to circulate beneath the RF coil substrate (95). Temperature feedback can be provided by an appropriate MR-compatible thermocouple placed closed to the air inlet (not shown).

The airflow manifold (180) provides temperature control for the sample (125), which is important for lengthy imaging studies of sensitive living organisms such as developing embryos. Air flow (172), (200), (210) beneath the stage serves two purposes: 1) additional active dissipation of heat generated by the magnetic field gradient module (100) and 2) effective thermal insulation of the sample (125) from the magnetic field gradient module (100). The combination of active cooling and insulation provided by air flow is effective at preventing unwanted heating of the sample (125). Air flow is more readily generated in the approximately 1 mm wide gap between the RE coil substrate (95) and magnetic field gradient module (100) than water flow, and requires no additional electrical insulation.

Therefore, thermostatically controlled air flow in a thin gap between the magnetic field gradient module (100) and sample stage provides both active cooling and insulation between the upper surface of the magnetic field gradient module (100) and the sample stage itself. Such active insulation approach makes the stage microscope design according to the present disclosure useful for the MR microscopy of living systems.

Figure 5:
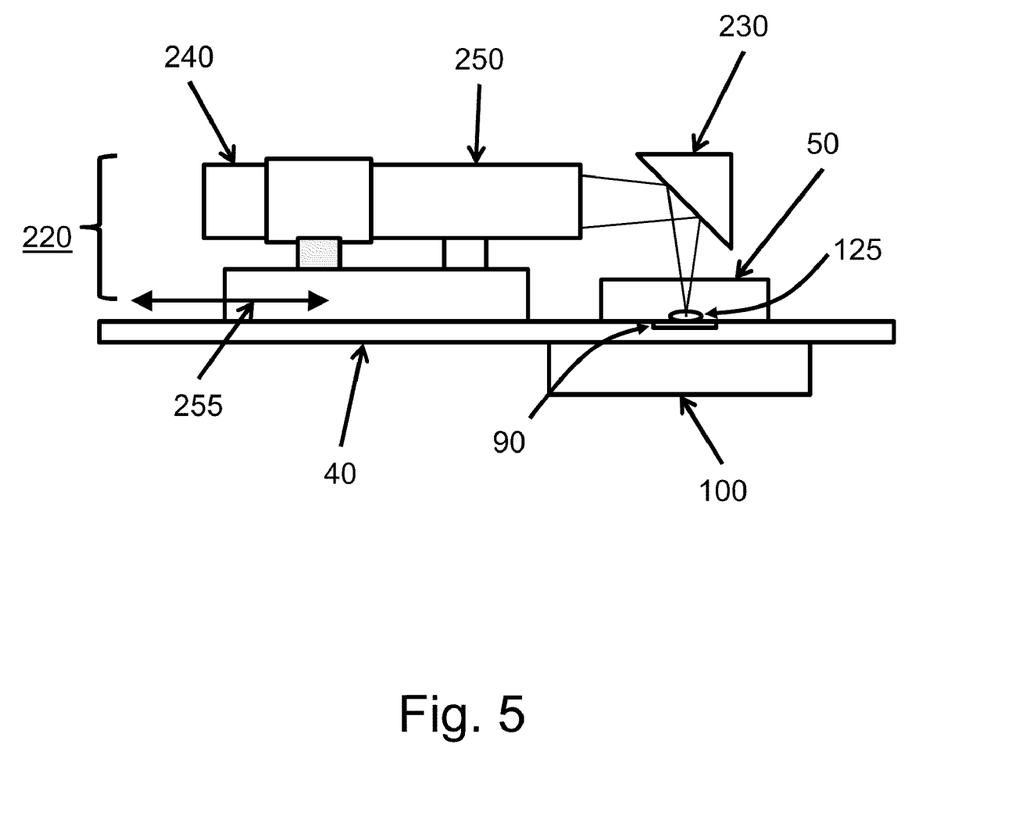
FIG. 5 is a cross sectional schematic view showing an MR stage microscope incorporating an overhead optical microscope.

FIG. 5 is a cross sectional schematic view of a further embodiment of the present disclosure, showing an MR stage microscope incorporating an overhead optical microscope. A possible commercial example of such a microscope can be a "Leica Monozoom 7" optical system. In particular, an MR compatible (that is, avoiding substantial ferromagnetic materials and replacing any ferromagnetic hardware: with non-ferromagnetic equivalents) optical microscope (220) is mounted axially (i.e. parallel to the long-axis of the magnet and the main polarizing magnetic field) above the horizontal stage (40). The working distance of the microscope (220) (distance from the objective lens to the sample) is made sufficiently large to allow the use of a 45° mirror (230) to view the sample (125), and is typically greater than 50 mm. For example, the Leica Monozoom 7 optical system mentioned above can be configured with a working distance of 79 mm. The microscope (220) focuses on the sample (125) via the plane 45° mirror (230), also secured to the horizontal stage (40). For example, mirror (230) can be attached to an adjustable, non-ferromagnetic optical mount (not shown) which in turn is attached to the horizontal stage (40). An MR-compatible CCD camera (240) is attached to the optical microscope barrel (250) with an appropriate adaptor (not shown). For example, a Minivid® USB CCD camera (LW Scientific, Inc.) with a 1.3 megapixel (1280×1024) sensor can be provided. The CCD camera is designed to replace many commercial microscope eyepieces. The adaptor can be an eyepiece adaptor provided by Leica. One or more light sources (within the bore or outside the bore with fiber optic transmission—neither shown) illuminate the sample (125).

The optical microscope (220) allows the sample (125) to be positioned at a greater distance from the objective lens, allowing the microscope (220) to be placed axially within the magnet bore.

The optical microscope (220) provides a second imaging mode for comparison and validation of the MR images acquired with the stage microscope. In opaque samples, light microscopy may be used to follow surface cell motions in organisms while simultaneously acquiring MR images of internal cell motions. Preferably, the CCD camera (240) is compatible with high magnetic field environments (greater than 3 Tesla) to allow convenient digital image capture. Many CCD cameras currently available function at very high magnetic field strengths, provided they do not incorporate ferromagnetic components.

Optical microscopy also provides accurate, real-time sample positioning capabilities for the stage microscope. Optical microscopy typically requires high power illumination, often at specific wavelengths. The open design of the MR stage microscope allows a variety of illumination sources to be used, either within the magnet bore (for MR-compatible light sources) or via fiber optic bundles from outside the magnet bore.

As shown in FIG. 5, a holder (255) is provided, to allow displacement of the microscope (220) in the z direction.

Figure 6:
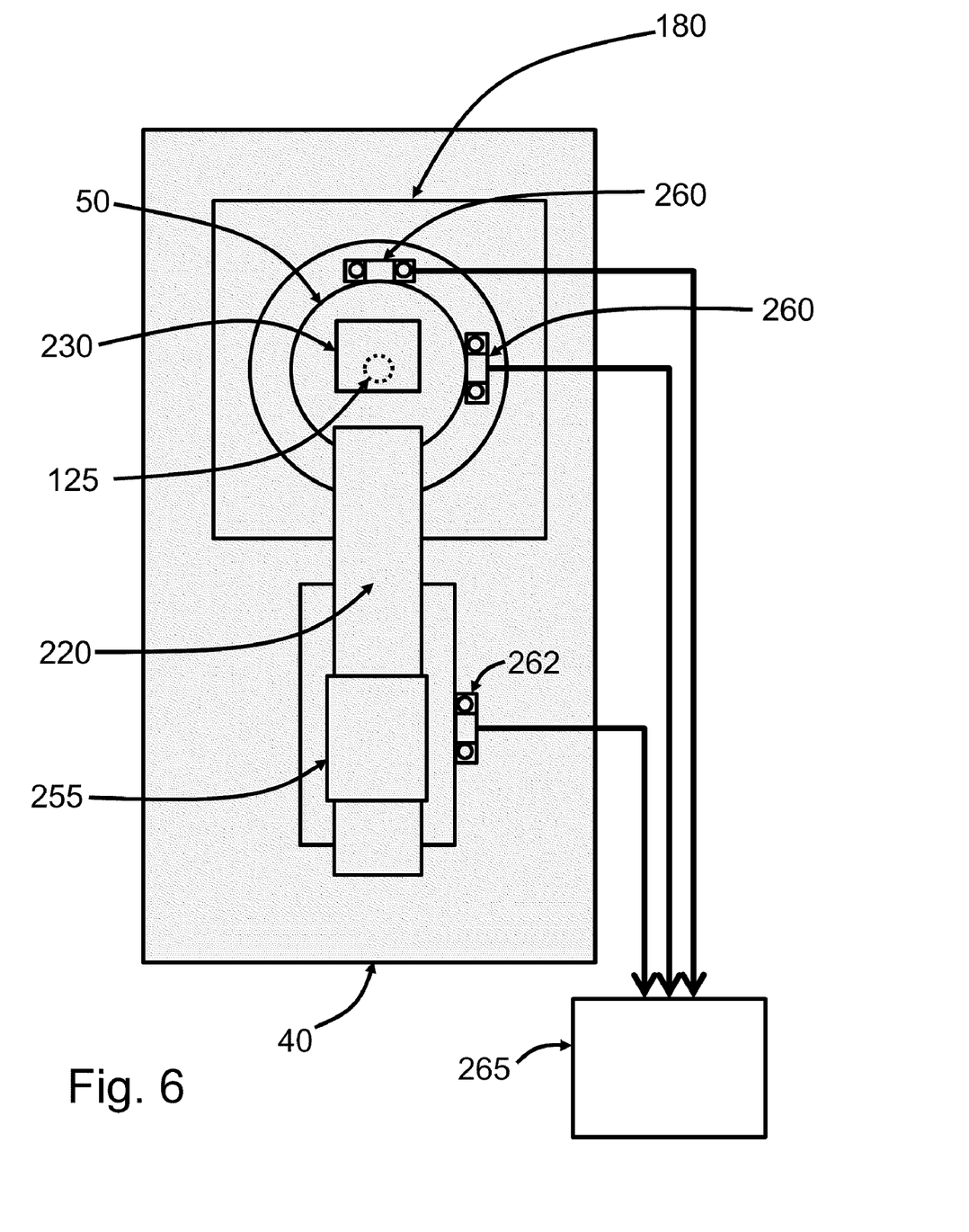
FIG. 6 is a view from the top of the embodiment shown in FIG. 5.

The displacement assembly according to the present disclosure is better shown in FIG. 6, where the structure of FIG. 5 is seen from the top. As shown in FIG. 6, a three-axis MR-compatible actuator (262) allows microscope (220) to focus in the z direction—effectively y direction using the 45° mirror (230).

MR-compatible piezoelectric actuators (260) can be used to provide fine x-z positioning control of the incubator-manifold assembly. Examples of these actuators include the N-310 Compact NEXACT® (Physik Instrumente) and the SQ-100NM (New Scale Technologies). As also shown in FIG. 6, fine x-z positioning of the incubator (50) over the RF coil(s) and beneath the microscope (250) focus can be achieved using two piezo actuators (260) attached to the RF coil substrate and the outside of the incubator (50). The incubator (50) slides over the RF coil substrate under control of the actuators (260), which are in turn controlled by a processor or computer (265) outside the magnetic field. The fixed focus of the optical microscope (220) is made coincident with the sample (125) by moving the optical microscope assembly in the z (axial) direction. This is achieved with a third actuator (262) attached to both the horizontal stage frame (40) and the optical microscope assembly (220). The optical microscope assembly (220) is constrained to slide in the z direction by rails on the stage frame (40). The rails can be fabricated from non-ferrous material (titanium, stainless steel, brass, nylon, Teflon etc). The rails are secured to frame (40) and can register with a guide (not shown) in the base of the optical microscope assembly (220).

The integration of an optical microscope with the MR stage microscope allows dual-modal imaging with both light and MRI. The one-sided nature of the MR gradient set (100) and RF coil (90) allows easy and flexible optical access to the sample from above. Light microscopy can range from conventional white light illuminated imaging, through fluorescence microscopy under ultraviolet excitation, to multi-photon laser scanning microscopy.

FIGS. 7(a)-7(c) show variants of the RF coil or coils (90) shown in FIGS. 2 and 3. According to the embodiments shown in these figures, the RF coil or coils can be etched into a substrate and connected to a conventional tuning/matching circuit also fabricated on the substrate. The RF coil substrate (95) may be double sided (copper on both upper and lower surfaces) to allow crossing of conductors.

FIG. 7(a) shows a simple transmit-receive (transceiver) arrangement, with a single loop (300) used for both transmission and reception of the RF signal. Also shown in the figure is a tuning capacitor (310).

FIG. 7(b) shows a transmit-receive pair, with the larger coil (320) used exclusively for RE transmission and the smaller, inner coil (330) used exclusively for RF reception. An appropriate decoupling circuit, known as such in the art, can be used to prevent reception on the transmit coil and transmission on the receive coil.

FIG. 7(c) shows a planar two-element transceiver phased array with two mutually decoupled loop coils (340), (350). Combination of more than two elements is possible.

Also possible, is a fourth variant (not shown), with a large transmit coil and multiple phased-array receive coils.

FIGS. 8(a)-8(d) show stream function optimization of the planar current density for the uniplanar gradient coils, provided in the magnetic field gradient module (100), employed by the MR stage microscope of the present disclosure.

Figure 8:
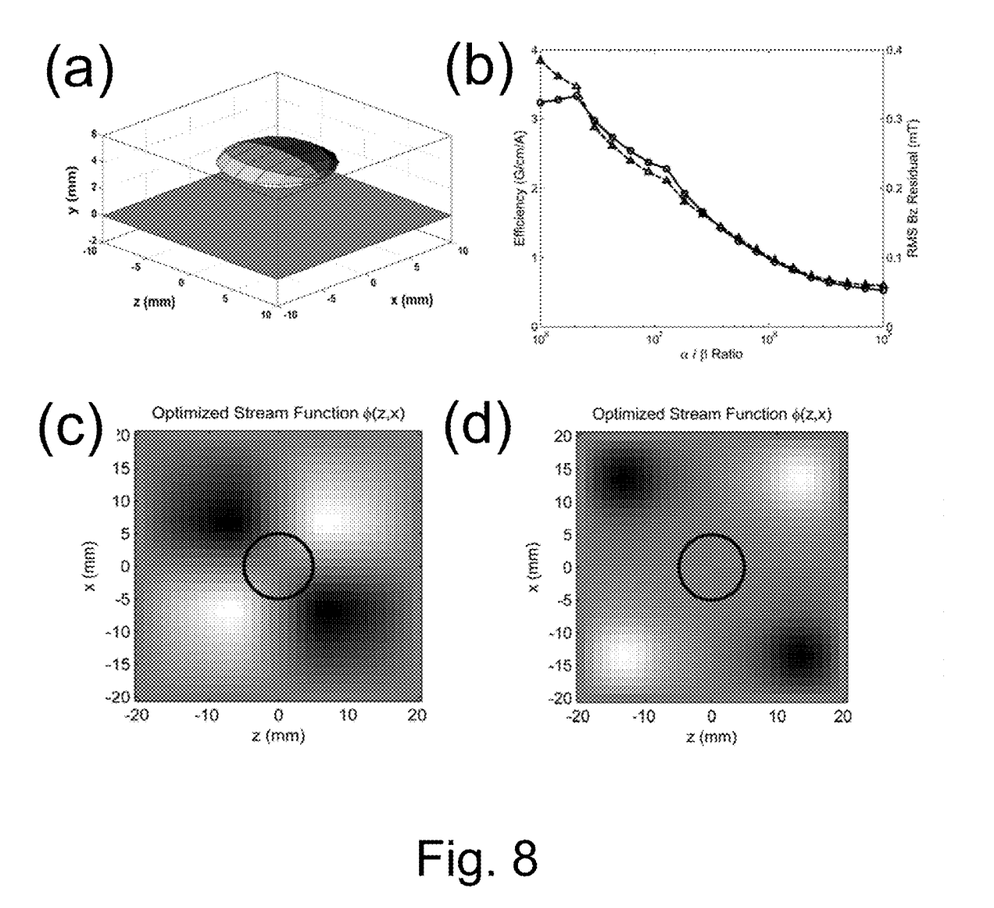
FIGS. 8(a)-8(d) show: stream function optimization of the planar current density for the uniplanar gradient coils employed by the MR stage microscope of the present disclosure.

FIG. 8(a) shows the volume of uniformity over which the magnetic field gradient generated by a given current density is optimized. The z-component of the generated field is specified over the surface of the elliptical volume of interest, which is defined approximately 5-10 mm above the current plane for a 40 mm square current density.

FIG. 8(b) shows the trade-off between gradient linearity (measured as the mean square residual difference between the generated field gradient and the target field gradient on the surface of the elliptical volume of uniformity), and gradient generation efficiency (measured in G/cm/A). As gradient generation efficiency increases, so does the residual difference between generated and target current.

FIG. 8(c) shows optimized current density generating a field gradient in the x direction. The location and size of the ellipsoidal volume of uniformity is projected onto the current density (black circle at center) for reference. The optimization was biased towards gradient efficiency, resulting in more current density closer to the volume of uniformity, at the expense of gradient linearity.

FIG. 8(d) shows optimized current density as for FIG. 8(c), except that the optimization was biased towards higher gradient linearity at the expense of gradient efficiency, resulting in more current density further from the volume of uniformity.

With reference to FIGS. 8(a)-8(d) above, the primary function of the magnetic field gradient generating conductor layers (gradient conductors) is to overlay a weak, linear spatial variation of the z-component of the magnetic field on the main magnetic polarizing field, conventionally in the z-direction. Optimizing the current density in the uniplanar gradient conductors 1) improves the linearity of the generated magnetic field gradients, reducing image distortion, 2) Increases the gradient strength for a given electrical current (gradient efficiency in G/cm/A), reducing resistive heating for a given gradient strength and 3) reduces total gradient coil inductance, allowing faster gradient switching for high speed imaging.

The planar gradient conductors for a horizontal bore magnet therefore lies in an x-z plane with the y direction, normal to the current plane, vertical or parallel to gravity. Uniplanar gradient coil windings were designed by the applicants using an adaptation of the stream function optimization by simulated annealing first suggested by Tomasi (Tomasi, D., *Stream Function Optimization For Gradient Coil Design*, Magnetic Resonance in Medicine 2001; 45(3):505-512). In particular, applicants generate planar current density using a vector stream function, $$J(r) = \nabla \times S(r) \tag{1}$$

which ensures current continuity. Since the current flows in an XZ plane, the vector stream function can be expressed in terms of a scalar function, as $$S(r) = \phi(r) \cdot \hat{y} \tag{2}$$

Applicants relate the current density to the generated magnetic field using the vector potential form of the time-invariant Biot-Savart equation $$A(r) = \frac{\mu_0}{4\pi} \int d^3 r' \frac{J(r')}{|r - r'|} \tag{3}$$

allowing numerical calculation of the magnetic field as the curl of the magnetic vector potential $$B(r) = \nabla \times A(r) \tag{4}$$

A compact representation of the 2D stream function may be achieved using Fourier, discrete cosine (Liu and Truwit, *True energy-minimal and finite-size biplanar gradient coil design for MRI*, IEEE Trans Med Imaging 1998; 17(5):826-830) or spline basis functions (as used in this embodiment) amongst others. Reducing the parameter space of the stream function allows for efficient constrained optimization of the current density. For further improvement in optimization efficiency, the target field can be calculated over a subset of points on the surface of an ellipsoid as opposed to every point within the volume of uniformity as show in FIG. 8(a).

Optimization of the stream function can be obtained by minimization of the following cost function:

$$\eta = \alpha \int d\Omega (B_{z(r)} - B_z^{targ}(r))^2 + \beta \int ds \left[ \left( \frac{\partial \phi}{\partial x} \right)^2 + \left( \frac{\partial \phi}{\partial z} \right)^2 \right], \tag{5}$$

where $\Omega$ is the surface of the ellipsoidal volume of uniformity FIG. 8(a) and S is the current plane at y=0. The weights α and β allow the uniformity of the generated magnetic field gradient (measured by the integral of the squared difference between the generated and target Bz field component) to be balanced against gradient current efficiency (represented indirectly by the x and z gradients of the stream function) as shown in FIGS. 8(c) and 8(d). The use of a 2D cubic spline with only 4 control points to approximate the current: density stream function allows for very rapid optimization. In this case, a 2D cubic spline is defined as the outer product of two one dimensional cubic splines in the x and z directions (the x spline and z spline respectively). A cubic spline is an interpolating function comprised of a series of piecewise cubic functions joined at control points. The first and second derivatives of each cubic function are equal at the control points resulting in a smooth function interpolating between values at the control point locations. According to an embodiment of this disclosure, the 1D splines consist of four control points. The first and last control points take fixed values and the central two control points are allowed to vary during optimization. The spline function as a whole is scaled by an additional factor during optimization to allow the resulting magnetic field to approach the target field in magnitude. For the x gradient coil, the first and last values of x spline and z spline are fixed at zero. For the y gradient the first point of the x spline (x=0) is fixed at one and the last point fixed at zero, and the first and last points of the z spline are fixed at zero. For the z gradient, the first point of the x spline (x=0) and the first point of the z spline (z=0) are fixed at one, and the last points of both splines fixed at zero. For each gradient coil, the 2D spline covers a quadrant of the winding pattern. The remaining quadrants of the stream function are generated by reflection in the x and z axes. According to an embodiment of this disclosure, optimization times (32×32 stream function sampling and 20 calculation points) are less than 1 minute in a typical desktop computer.

Figure 9:
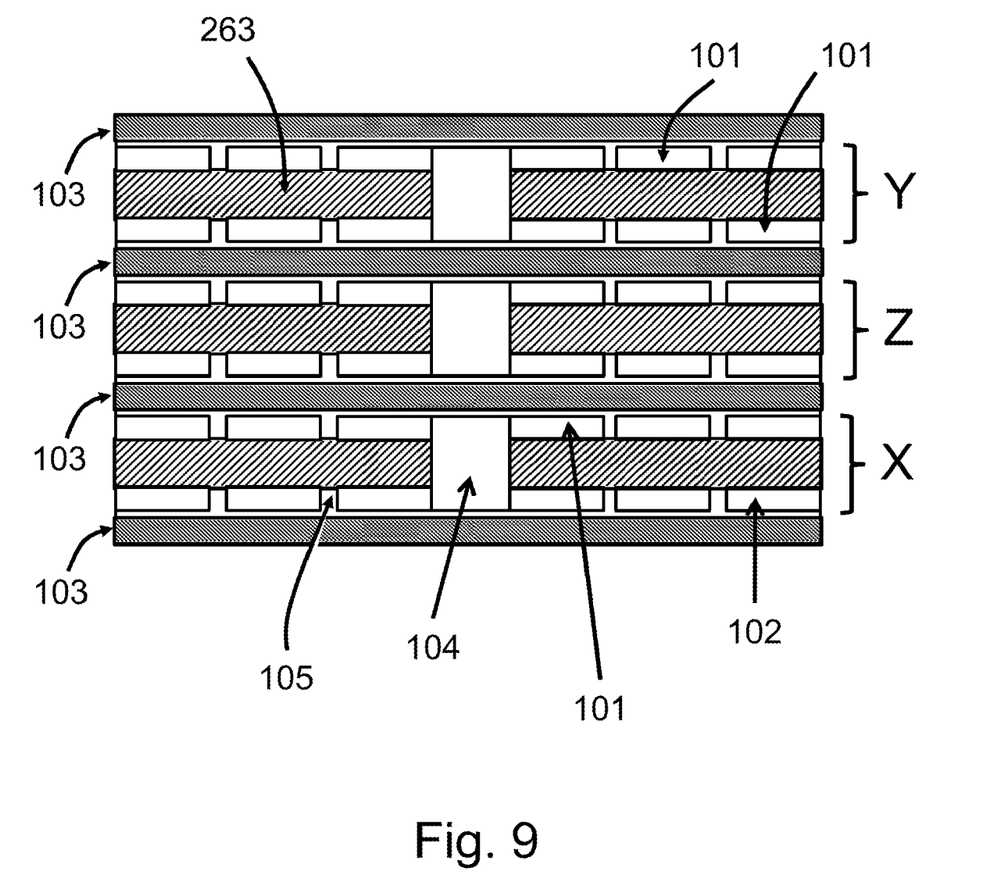
FIG. 9 shows an example of a magnetic field gradient module to be used with the present disclosure.

FIG. 9 is a schematic cross-section through the magnetic field gradient module (100) showing the upper (101) and lower (102) copper conductor layers for each gradient axis (x, y, z). Also shown are the electrical insulation layer (103) between adjacent conductor layers, a conductive connection (104) between the upper and lower layers at the center of the spirals (these would not be in the same location in x, y and z patterns, but are shown as such for simplicity), and the copper laminate substrate (263). The order of gradient coils from top to bottom is shown as Y, Z, X but can take any order depending on the relative designed efficiencies or particular heating properties of the coils. The coil likely to generate the most heat during normal operation is placed at the bottom, closest to the ceramic block and heat exchanger. Also shown in FIG. 9 is a thermoconductive grease or high thermal conductivity epoxy resin (105) to thermally couple the gradient conductor layer.

FIGS. 10(a)-10(d) show steps of the conversion from stream function (see equation (5) above) contours to final mask artwork for copper etching. In particular, FIG. 10(a) shows the stream function contours for one quadrant of an x-gradient gradient coil. FIG. 10(b) shows duplication by mirroring of the contours to form the full pattern. The contour paths are used to generate the inner and outer margins of the gaps between conductor tracks (400). The tracks are formed into a continuous spiral by breaking the track at appropriate points and rejoining to the next outermost track. Also shown in FIG. 10(b) are registration marks (410). FIG. 10(c) shows how connectors (420) are added to allow convenient connection to the gradient amplifiers (outside the magnetic field). In FIG. 10(d) the pattern is filled (430) and used as a negative etch mask, i.e. copper is retained where the mask is dark. This mask represents the upper coil for an x-gradient. The upper and lower patterns are joined at the center of each spiral (white hole (440) in mask).

FIGS. 11(a)-11(f) show conductor etching masks for the magnetic field gradient module (100), where exemplary current flow directions for a positive potential difference between the input and output connectors are shown. The gradient current may flow positively or negatively through the coil, with the relative current senses preserved (i.e., negative current would reverse all the arrow directions). In particular: FIG. 11(a) shows a conductor etching mask for the x gradient lower side; FIG. 11(b) shows a conductor etching mask for the x gradient upper side; FIG. 11(c) shows a conductor etching mask for the y gradient lower side; FIG. 11(d) shows a conductor etching mask for the y gradient upper side; FIG. 11(e) shows a conductor etching mask for the z gradient lower side; and FIG. 11(f) shows a conductor etching mask for the z gradient upper side. The gradient conductor masks are used to generate a photoresist for chemical etching of the copper layers on a substrate. FIGS. 11(a)-11(f) also show the current path through each conductor pattern, the cables leading to the gradient amplifiers and the connections between the upper and lower conductor patterns. The upper and lower patterns are etched from double-sided copper laminate and joined at the center of each spiral.

Each mask is derived from the contours of the current density stream function, as shown in FIGS. 10(a)-10(d). The patterns of FIGS. 11(a)-11(f) are designed to be etched from a double sided copper laminate with a high thermal conductivity substrate. The spiral patterns of the upper and lower sides are joined at their centers to allow electrical current to pass through both sides of the conductor with input and output leads at the periphery of the pattern only.

Gradient conductor layers are electrically insulated from each other with 90 μm thick Mylar® film and thermally coupled to each other with thermoconductive grease or high thermal conductivity epoxy resin to assist in heat dissipation to the water cooling system. See, for example, material (105) in FIG. 9. Thermocouples for optional monitoring of gradient system internal temperature can be integrated either between gradient axis layers or superficially on the magnetic field gradient module. Gradient conductors are connected to the MR system gradient amplifiers by air cooled heavy gage copper wiring (10-14 AWG). The gradient amplifiers can be located in a neighboring room outside the magnetic field. The use of a high thermal conductivity substrate for the gradient conductors and a high thermal conductivity epoxy resin to bond the gradient laminates together allows for very compact designs with improved heat dissipation properties. This in turn allows higher duty cycles for current pulsing during MR imaging.

By convention, the conductor winding pattern required to generate field gradients in each of the x, y and z directions is derived from equally spaced contours of the corresponding optimized scalar stream function shown in FIG. 10(a). Symmetry of the x and y gradient winding patterns can be used to simplify this process, and the contour pattern replicated appropriately. In particular, the x and y gradient patterns are mirrored or rotated repeats of the same basic pattern (four repeats of each quadrant pattern for x, two repeats of the half pattern for y). The z winding pattern is a single repeat of the basic pattern. Wide conductors can be constructed that are separated by the contour or contour spiral, provide an equivalent current density to the discrete wire approach, but at significantly reduced total electrical resistance.

Connectors (420) (see FIG. 10(c)) between sections of the winding pattern with leads to the current supply cables can be added using a commercial drafting package, such as SolidWorks® (SolidWorks, Concord, Mass.) or AutoCAD® (Autodesk Inc., San Rafael, Calif.). The completed artwork is used to generate a mask for photochemical etching or to guide direct milling of the gradient coil conductors.

Double-sided conductor laminates allow the total thickness of the gradient conductor laminates to be kept to a minimum, resulting in improved current efficiency and eliminating the need for connections to and from the center of the winding pattern to the outside of the winding pattern. Spiral conductor windings are joined through the laminate at their centers and current need only to be fed to the pattern at the edges.

Accordingly, what has: been shown is a magnetic resonance stage microscope. While this magnetic resonance stage microscope has been described by means of specific embodiments and applications thereof, it is understood that numerous modifications and variations could be made thereto by those skilled in the art without departing from the spirit and scope of the disclosure. It is therefore to be understood that within the scope of the claims, the disclosure may be practiced otherwise than as specifically described herein.

What is claimed is:

1. A magnetic resonance microscope comprising:
   a horizontal stage above which a sample to be analyzed through the magnetic resonance microscope is adapted to be located;
   a radiofrequency coil assembly located above the horizontal stage, the sample adapted to be located above the radiofrequency coil assembly and to be excited by the radiofrequency coil assembly;
   a magnetic field gradient module to generate a magnetic field, the magnetic field gradient module located under the horizontal stage; and
   a heat exchange unit thermally coupled to the magnetic field gradient module and located under the magnetic field gradient module.

2. The magnetic resonance microscope of claim 1, wherein the horizontal stage is part of a stage frame, the stage frame further comprising two entire or partial disks supporting the horizontal stage.

3. The magnetic resonance microscope of claim 2, wherein the two disks are entire or partial circular polycarbonate disks.

4. The magnetic resonance microscope of claim 1, further comprising an incubation chamber adapted to contain the sample to be analyzed, the incubation chamber being located above the radiofrequency coil assembly.

5. The magnetic resonance microscope of claim 4, wherein the incubation chamber is located directly on the radiofrequency coil assembly.

6. The magnetic resonance microscope of claim 1, wherein the radiofrequency coil assembly comprises one or more coils selected from the group consisting of: a transmit coil, a receive coil, a transmit and receive coil, an array of coils.

7. The magnetic resonance microscope of claim 1, further comprising a high thermal conductivity ceramic block to thermally couple the heat exchange unit to the magnetic field gradient module.

8. The magnetic resonance microscope of claim 7, wherein the high thermal conductivity ceramic block, magnetic field gradient module and heat exchange unit are secured to each other and to the horizontal stage.

9. The magnetic resonance microscope of claim 1, further comprising tuning rods to tune the radiofrequency coil assembly.

10. The magnetic resonance microscope of claim 1, wherein the radiofrequency coil assembly is a plurality of substantially planar radiofrequency coils.

11. The magnetic resonance microscope of claim 1, wherein the magnetic field gradient module comprises three copper laminates, one for each direction of a field gradient of the magnetic resonance microscope.

12. The magnetic resonance microscope of claim 11, wherein the copper laminates are double-sided copper laminates.

13. The magnetic resonance microscope of claim 1, further comprising a gap between the horizontal stage and the magnetic field gradient module.

14. The magnetic resonance microscope of claim 13, wherein the gap is an air-cooling gap.

15. The magnetic resonance microscope of claim 14, further comprising a manifold located above the horizontal stage, the manifold being in fluidic communication with locations above the horizontal stage and below the horizontal stage to allow an airflow for temperature control of the sample and of the magnetic field gradient module.

16. The magnetic resonance microscope of claim 15, wherein the airflow is a thermostatically controlled airflow.

17. A superconductive magnet with a horizontal bore, the superconductive magnet comprising the magnetic resonance microscope of claim 1, the magnetic resonance microscope being located in the horizontal bore.

18. A dual-mode optic and magnetic resonance microscope system, comprising:
   a) a magnetic resonance microscope; and
   b) an optical microscope,
wherein the magnetic resonance microscope comprises:
   a1) a horizontal stage above which a sample to be analyzed through the magnetic resonance microscope and the optical microscope is adapted to be located;
   a2) a radiofrequency coil assembly located above the horizontal stage, the sample adapted to be located above the radiofrequency coil assembly and to be excited by the radiofrequency coil assembly;
   a3) a magnetic field gradient module to generate a magnetic field, the magnetic field gradient module located under the horizontal stage; and
   a4) a heat exchange unit thermally coupled to the magnetic field gradient module and located under the magnetic field gradient module,
wherein the optical microscope comprises:
   b1) a mirror located above the sample.

19. The dual-mode optic and magnetic resonance microscope system of claim 18, wherein the mirror is a plane mirror at 45 degrees to the plane of the stage.

20. The dual-mode optic and magnetic resonance microscope system of claim 18, wherein the optical microscope is axially located along the horizontal stage of the magnetic resonance microscope.

21. The dual-mode optic and magnetic resonance microscope system of claim 20, further comprising one or more actuators on the horizontal stage to control location of the optical microscope along the horizontal stage with respect to the sample.

22. The dual-mode optic and magnetic resonance microscope system of claim 20, further comprising:
   c) a CCD camera attached to the optical microscope.

23. A superconductive magnet with a horizontal bore, the superconductive magnet comprising the dual-mode optic and magnetic resonance microscope of claim 18.

* * * * *